United States Patent
Li et al.

(10) Patent No.: US 10,522,215 B2
(45) Date of Patent: Dec. 31, 2019

(54) READING CIRCUIT AND METHOD

(71) Applicant: Shanghai Zhaoxin Semiconductor Co., Ltd., Shanghai (CN)

(72) Inventors: Wenxiao Li, Shanghai (CN); Jiesheng Chen, Shanghai (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 13 days.

(21) Appl. No.: 15/797,726

(22) Filed: Oct. 30, 2017

(65) Prior Publication Data

US 2019/0043561 A1 Feb. 7, 2019

(30) Foreign Application Priority Data

Aug. 2, 2017 (CN) .......................... 2017 1 0651087

(51) Int. Cl.
*G11C 11/419* (2006.01)
*G11C 11/412* (2006.01)
*G11C 7/06* (2006.01)

(52) U.S. Cl.
CPC ............ *G11C 11/419* (2013.01); *G11C 7/065* (2013.01); *G11C 11/412* (2013.01)

(58) Field of Classification Search
CPC ....................... G11C 11/419; G11C 11/412
USPC ........................................................ 365/156
See application file for complete search history.

(56) References Cited

U.S. PATENT DOCUMENTS

| 5,550,777 | A | 8/1996 | Tran | |
|---|---|---|---|---|
| 6,184,722 | B1 | 2/2001 | Hayakawa | |
| 2001/0028581 | A1* | 10/2001 | Yanagisawa | G11C 5/025 365/189.05 |
| 2006/0092735 | A1* | 5/2006 | Do | G11C 7/065 365/207 |
| 2007/0133327 | A1* | 6/2007 | Huang | G11C 7/065 365/207 |
| 2011/0026314 | A1* | 2/2011 | Hamouche | G11C 7/12 365/156 |
| 2012/0063252 | A1* | 3/2012 | Sharma | G11C 7/06 365/207 |
| 2014/0146625 | A1* | 5/2014 | Kurjanowicz | G11C 29/787 365/200 |
| 2017/0110182 | A1* | 4/2017 | Liaw | G11C 8/16 |

* cited by examiner

*Primary Examiner* — Hoai V Ho
*Assistant Examiner* — Muna A Techane
(74) *Attorney, Agent, or Firm* — McClure, Qualey & Rodack, LLP

(57) ABSTRACT

A reading circuit is provided in the invention. The reading circuit includes a sensitive amplifier circuit and a latch circuit. A sensitive amplifier circuit is coupled to a first bit line and a second bit line to connect with a storage device, and includes a first inverter and a second inverter. The first bit line is coupled to a source of a first transistor of the first inverter and the second bit line is coupled to a source of a second transistor of the second inverter. The latch circuit is coupled to the sensitive amplifier circuit and outputs an output signal generated by the sensitive amplifier circuit.

18 Claims, 3 Drawing Sheets

READING CIRCUIT AND METHOD

CROSS REFERENCE TO RELATED APPLICATIONS

This Application claims priority of China Patent Application No. 201710651087.2 filed on Aug. 2, 2017, the entirety of which is incorporated by reference herein.

BACKGROUND OF THE INVENTION

Field of the Invention

The invention generally relates to reading circuit technology, and more particularly, to reading circuit technology that combines a modified sensitive amplifier circuit with a single-ended-output latch circuit.

Description of the Related Art

When static random-access memory (SRAM) reads data, the reading speed is an important indicator of the SRAM. The crucial point of determining the reading speed depends on the design of the reading circuit.

A traditional reading circuit is usually realized by combining a sensitive amplifier and an SR latch. However, the structure of this reading circuit may use more power. Furthermore, the structure of this reading circuit needs a longer delay time to increase the reliability of the sensitive amplifier. Therefore, the reading speed will be affected by the longer delay time.

BRIEF SUMMARY OF THE INVENTION

A reading circuit and method are provided to overcome the problems mentioned above.

An embodiment of the invention provides a reading circuit. The reading circuit comprises a sensitive amplifier circuit and a latch circuit. The sensitive amplifier circuit is coupled to a first bit line and a second bit line to connect to a storage device, and comprises a first inverter and a second inverter. The first bit line is coupled to a source of a first transistor of the first inverter, and the second bit line is coupled to a source of a second transistor of the second inverter. The latch circuit is coupled to the sensitive amplifier circuit, and outputs an output signal generated by the sensitive amplifier circuit In some embodiments of the invention, the reading circuit further comprises a matching circuit, and the matching circuit is configured according to the latch circuit.

An embodiment of the invention provides a reading method. The reading method is applied to a reading circuit. The reading method comprises the step of reading data of a storage device from a first bit line and a second bit line by the reading circuit, wherein the first bit line is coupled to a drain of a first transistor of the first inverter of the reading circuit, and the second bit line is coupled to a drain of a second transistor of the second inverter of the reading circuit; and generating an output signal by a sensitive amplifier circuit of the reading circuit; and output the output signal by a latch circuit of the reading circuit.

Other aspects and features of the invention will become apparent to those with ordinary skill in the art upon review of the following descriptions of specific embodiments of methods and devices.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
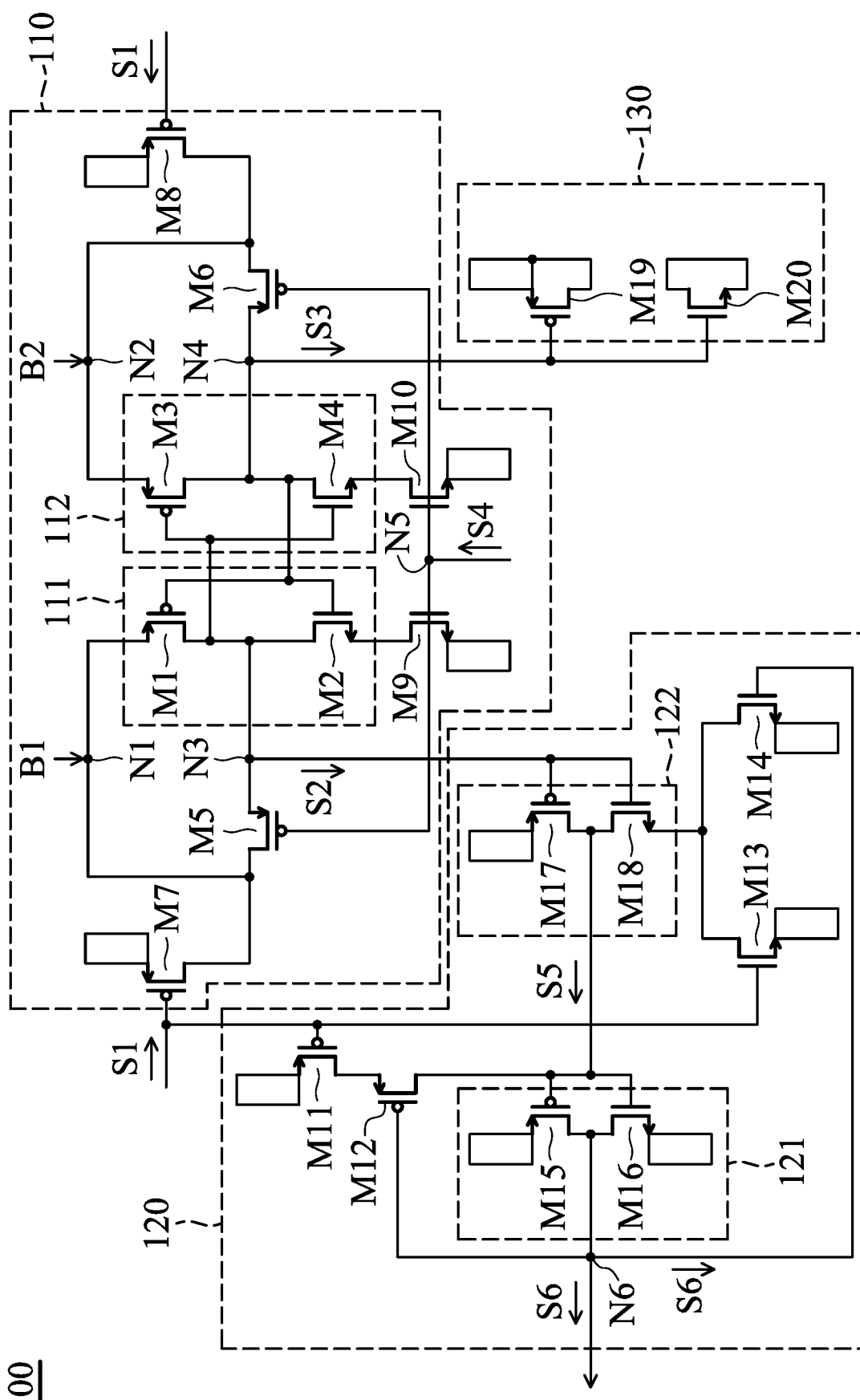
FIG. 1 is a block diagram of a reading circuit 100 according to an embodiment of the invention.

FIG. 1 is a block diagram of a reading circuit 100 according to an embodiment of the invention. The reading circuit 100 comprises a sensitive amplifier circuit 110, a latch circuit 120 and a matching circuit 130. Note that, in order to clarify the concept of the invention, FIG. 1 presents a simplified block diagram in which only the elements relevant to the invention are shown. However, the invention should not be limited to what is shown in FIG. 1.

According to the embodiment of the invention, the latch circuit 120 is a single-ended-output latch circuit, a SR latch circuit, or other latch circuit. As shown in FIG. 1, the latch circuit 120 is a single-ended-output latch circuit, but the invention should not be limited thereto.

As shown in FIG. 1, the sensitive amplifier circuit 110 comprises a first inverter 111 and a second inverter 112. The first inverter 111 comprises a first PMOS M1 and a first NMOS M2. The second inverter 112 comprises a second PMOS M3 and a second NMOS M4. The first inverter 111 and the second inverter 112 are cross coupled each other, and regarded as a bistable structure.

As shown in FIG. 1, the sensitive amplifier circuit 110 is coupled to a first bit line B1 of a storage device (not shown in FIG. 1) through a first node N1 and coupled to a second bit line B2 of the storage device through a second node N2 to read the required data from the storage device. According to an embodiment of the invention, the first bit line B1 is coupled to a source of the first PMOS M1 and the second bit line B2 is coupled to a source of the second PMOS M3. The first bit line B1 is further coupled to a drain of a third PMOS M5 of the sensitive amplifier circuit 110, and the second bit line B2 is further coupled to a drain of a fourth PMOS M6 of the sensitive amplifier circuit 110. Namely, the signal transmitted from the first bit line B1 and second bit line B2 may be transmitted to the sensitive amplifier circuit 110 through two paths. One path is the first PMOS M1 and the second PMOS M3. The other path is the third PMOS M5 and the fourth PMOS M6.

Compared to a traditional sensitive amplifier circuit, in the sensitive amplifier circuit 110 provided in the invention, two paths utilized to transmit the signal transmitted from the first bit line B1 and second bit line B2 increase the reliability of the sensitive amplifier circuit. Specifically, for the path of the third PMOS M5 and the fourth PMOS M6, when the third PMOS M5 and the fourth PMOS M6 are enabled, the output signal of the sensitive amplifier circuit 110 will be changed following the variety of the signal transmitted from the first bit line B1 and second bit line B2. Furthermore, for the path of the first PMOS M1 and the second PMOS M3, the first PMOS M1 and the second PMOS M3 may also receive the varied signal transmitted from the first bit line B1 and second bit line B2. Therefore, when the output signal of the sensitive amplifier circuit 110 fails to be reversed, the signal received by the first PMOS M1 and the second PMOS M3 can be utilized to re-reverse and modify the output signal of the sensitive amplifier circuit 110.

As shown in FIG. 1, the sensitive amplifier circuit 110 comprises a fifth PMOS M7 and a sixth PMOS M8. The fifth PMOS M7 and the sixth PMOS M8 may receive the pre-charge control signal S1. When the pre-charge control signal S1 is 0, the fifth PMOS M7 and the sixth PMOS M8 are enabled, and when the pre-charge control signal S1 is 1, the fifth PMOS M7 and the sixth PMOS M8 are disabled. Before reading data from the storage device (initial stage), the sensitive amplifier circuit 110 may charge all nodes to an initial voltage (e.g. charge to the source voltage Vdd0, Vdd0=1V) according to the pre-charge control signal S1 (in the state, the pre-charge control signal S1 is 0). When the sensitive amplifier circuit 110 starts to enter to a delay stage, the pre-charge control signal S1 will be changed to 1 and the fifth PMOS M7 and the sixth PMOS M8 will be disabled.

The pre-charge control signal S1 is also transmitted to the latch circuit 120 to control whether the latch circuit 120 is in a latch state or an enabled state. For example, when the pre-charge control signal S1 is 1, the latch circuit 120 is in the enabled state, and when the pre-charge control signal S1 is 0, the latch circuit 120 is in the latch state.

As shown in FIG. 1, the sensitive amplifier circuit 110 comprises a third node N3 corresponding to a first output end and a fourth node N4 corresponding to a second output end. The sensitive amplifier circuit 110 may output a first sensitive amplifier output signal S2 and a second sensitive amplifier output signal S3 to the latch circuit 120 and the matching circuit 130 through the third node N3 and the fourth node N4 respectively.

According to the embodiment of the invention, in the delay stage, the path between the first node N1 and the third node N3 is connected, and the path between the second node N2 and the fourth node N4 is connected. Namely, the output signal transmitted from the first bit line B1 and second bit line B2 may be transmitted to the third node N3 and the fourth node N4. Furthermore, in the delay stage, the storage device may discharge the first bit line B1, and the electric potential of the second bit line B2 is maintained so that there is a voltage difference between the first sensitive amplifier output signal S2 of the third node N3 and the second sensitive amplifier output signal S3 of the fourth node N4. In a reading stage, the path between the first node N1 and the third node N3 will be dis-connected, and the path between the second node N2 and the fourth node N4 will be dis-connected.

As shown in FIG. 1, the sensitive amplifier circuit 110 comprises a fifth node N5 to receive an amplified enable-signal S4. When the sensitive amplifier circuit 110 receives the amplified enable-signal S4 (i.e. amplified enable-signal S4 is 1), the third PMOS M5 and fourth PMOS M6 may be disabled, and a third NMOS M9 and a fourth NMOS M10 of the sensitive amplifier circuit 110 may be enabled to disconnect the path between the first node N1 and the third node N3 and the path between the second node N2 and the fourth node N4. Namely, when the sensitive amplifier circuit 110 does not receive the amplified enable-signal S4 (i.e.

amplified enable-signal S4 is 0), the third PMOS M5 and fourth PMOS M6 may be enabled, and the third NMOS M9 and the fourth NMOS M10 of the sensitive amplifier circuit 110 may be disabled to connect the path between the first node N1 and the third node N3 and the path between the second node N2 and the fourth node N4.

As shown in FIG. 1, the latch circuit 120 comprises a seventh PMOS M11, an eighth PMOS M12, a third inverter 121, a fourth inverter 122, a fifth NMOS M13 and a sixth NMOS M14. The third inverter 121 comprises a ninth PMOS M15 and a seventh NMOS M16, and the fourth inverter 122 comprises a tenth PMOS M17 and a eighth NMOS M18. The third inverter 121 is coupled to the output end of the fourth inverter 122 to receive a reversed signal S5 generated by the fourth inverter 122. The fourth inverter 122 is coupled to the third node N3 to receive the output signal S2 of the sensitive amplifier circuit 110.

According to an embodiment of the invention, when the pre-charge control signal S1 is 0, the seventh PMOS M11 is enabled, and the fifth NMOS M13 is disabled. When the pre-charge control signal S1 is 1, the seventh PMOS M11 is disabled, and the fifth NMOS M13 is enabled. When the fifth NMOS M13 is enabled, the fourth inverter 122 will be in an operation state to reverse the first sensitive amplifier output signal S2 received from the sensitive amplifier circuit 110 to the reversed signal S5. Then, the reversed signal S5 is transmitted to the third inverter 121. The third inverter 121 may reverse the reversed signal S5 to generate an output signal S6 at an output node N6. For example, when the first sensitive amplifier output signal S2 is 0 (low electric potential), the fourth inverter 122 may reverse the first sensitive amplifier output signal S2 to 1 (high electric potential) to generate the reversed signal S5. Then, the third inverter 121 may reverse the reversed signal S5 to 0 (low electric potential) to generate the output signal S6 (i.e. the output data of the reading circuit 100).

The output signal S6 may also be transmitted to the sixth NMOS M14. When the NMOS M14 receives the output signal S6 which has low electric potential, the sixth NMOS M14 will be disabled. Furthermore, after the output signal is generated, the pre-charge control signal S1 and the amplified enable-signal S4 may be changed from 1 to 0. Therefore, the seventh PMOS is enabled and the fifth NMOS M13 is disabled to latch the output data.

As shown in FIG. 1, the matching circuit 130 comprises an eleventh PMOS M19 and a ninth NMOS M20. The eleventh PMOS M19 and the ninth NMOS M20 are coupled to the fourth node N4 to receive the second sensitive amplifier output signal S3. The configuration of the eleventh PMOS M19 and the ninth NMOS M20 is corresponded to the configuration of the tenth PMOS M17 and the eighth NMOS M18 of the latch circuit 120 to ensure the load of the third node N3 matches the load of the fourth node N4.

Figure 2:
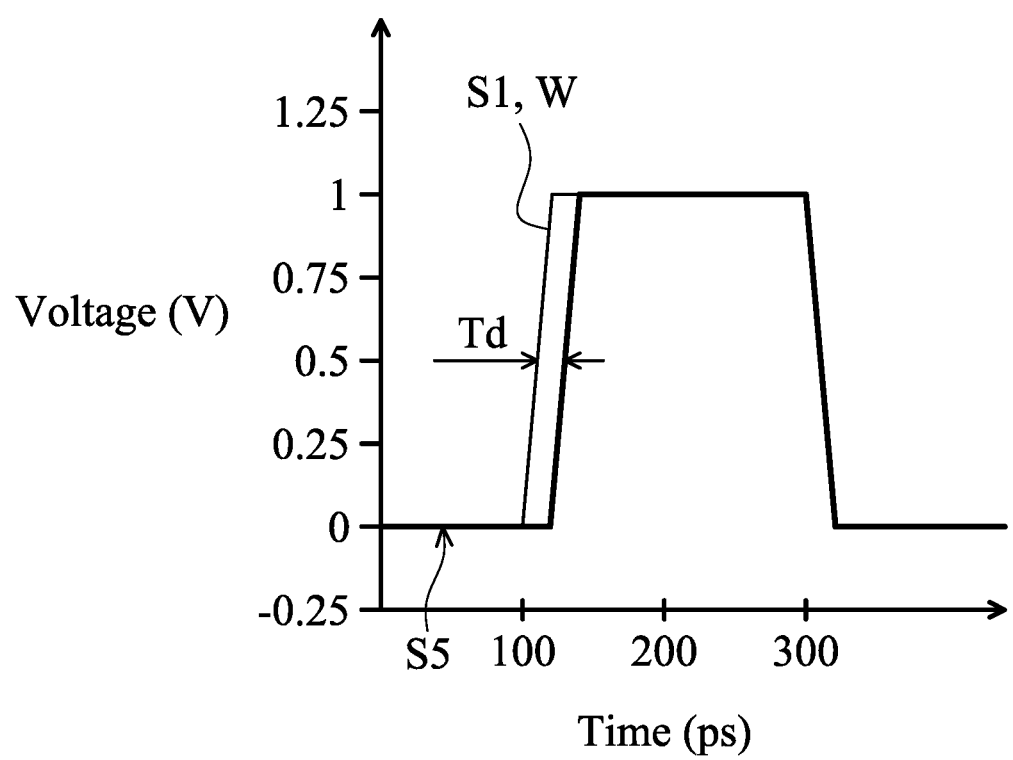
FIG. 2 is a waveform diagram 200 corresponding to a word line signal, a pre-charge control signal and an amplified enable-signal according to an embodiment of the invention.

FIG. 2 is a waveform diagram 200 corresponding to a word line signal, a pre-charge control signal and an amplified enable-signal according to an embodiment of the invention. The waveform diagram of FIG. 2 can be applied to reading circuit 100. The reading circuit 100 will be taken to illustrate the waveform diagram 200 of FIG. 2 below.

The word line signal W of FIG. 2 means the word line of the storage device. When the word line signal W is in high electric potential, it means that the data stored in the storage unit of the storage device will be read. Furthermore, the delay time Td of the delay stage means the delay between the word line signal W and the amplified enable-signal S4 and the delay the pre-charge control signal S1 and the amplified enable-signal S4. The delay time Td needs to achieve a specific value to ensure the reliability of the sensitive amplifier reading the data. Compared to the traditional reading circuit, in the structure of the reading circuit 100 of the invention, the shorter delay time can be adopted to achieve the same reliability to reduce the impact of delay time Td for the reading speed.

As shown in FIG. 2, the period of the reading circuit 100 reading the data from the storage device may be divided into four stages. In initial stage (0~100 ps), the word line signal W, the pre-charge control signal S1 and the amplified enable-signal S4 are 0V. Therefore, the fifth PMOS M7 and the sixth PMOS M8 are enabled, and the first node N1, the second node N2, the third node N3 and the fourth node N4 are pre-charged to an initial voltage (e.g. charged to a source voltage Vdd0, Vdd0=1V). Furthermore, in the initial stage, the electric potentials of the first bit line B1 and the second bit line B2 are pulled to the initial voltage. When the initial stage has expired, a delay stage will be entered.

In the delay stage (during delay time Td), the word line signal W and the pre-charge control signal S1 are 1V and the amplified enable-signal S4 is 0V. Therefore, the path between the first node N1 and the third node N3 is connected, and the path between the second node N2 and the fourth node N4 is connected. Furthermore, in the delay stage, the storage device discharges the first bit line B1 and the electric potential of the second bit line B2 is maintained so that there is a voltage difference between the first sensitive amplifier output signal S2 of the third node N3 and the second sensitive amplifier output signal S3 of the fourth node N4. When the delay storage expires, the reading stage will be entered.

In the reading stage, the word line signal W, pre-charge control signal S1 and the amplified enable-signal S4 are 1V. Therefore, the third PMOS M5 and the fourth PMOS M6 are disabled and the third NMOS M9 and the fourth NMOS M10 are enabled to ensure that the path between the first node N1 and the third node N3 is dis-connected, and that the path between the second node N2 and the fourth node N4 is dis-connected. Furthermore, in the reading stage, the first inverter 111 and the second inverter 112 may amplify the first sensitive amplifier output signal S2 and the second sensitive amplifier output signal S3 to amplify the voltage difference between the first sensitive amplifier output signal S2 and the second sensitive amplifier output signal S3 to a full-swing signal. Namely, the first sensitive amplifier output signal S2 is 0 (ground) and the second sensitive amplifier output signal S3 is source voltage. Then, the amplified first sensitive amplifier output signal S2 is outputted to the latch circuit 120 and outputted to the output node N6 through the latch circuit 120.

In the data latching stage, the word line signal W, pre-charge control signal S1 and the amplified enable-signal S4 are changed to 0V. The output data will be latched by the latch circuit 120 and the reading circuit backs to the initial stage.

Figure 3:
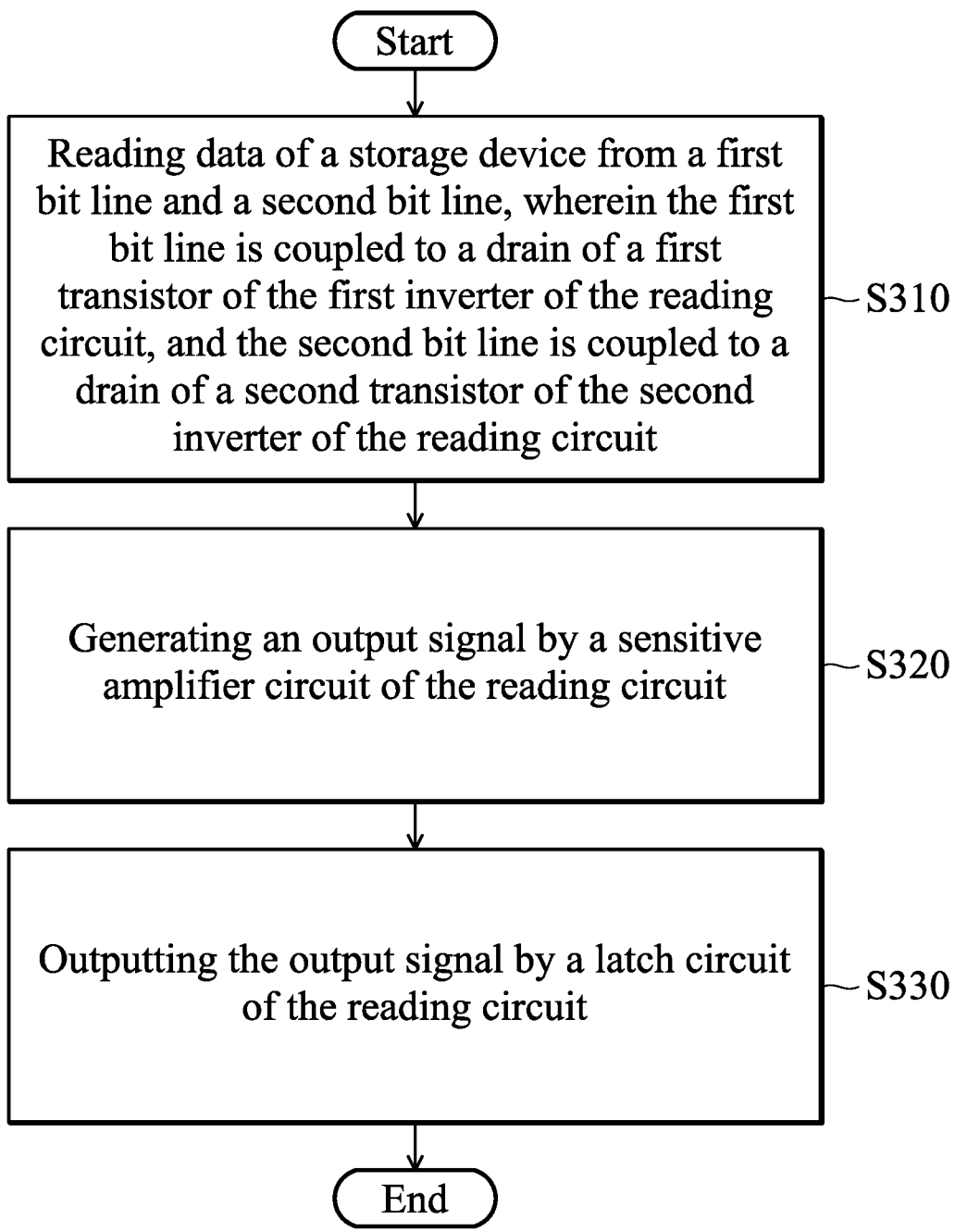
FIG. 3 is a flow chart 300 illustrating the reading method according to an embodiment of the invention.

FIG. 3 is a flow chart 300 illustrating the reading method according to an embodiment of the invention. The reading method is applied to the reading circuit 100. In step S310, the reading circuit 100 reads the data of a storage device from a first bit line and a second bit line, wherein the first bit line is coupled to a source of a first transistor of a first inverter of the reading circuit 100, and the second bit line is coupled to a source of a second transistor of a second inverter of the reading circuit 100. In step S320, a sensitive amplifier circuit of the reading circuit 100 generates an output signal. In step S330, a latch circuit of the reading circuit 100 output the output signal generated by the sensitive amplifier.

In some embodiments of the invention, the reading method of the flow chart 300 further comprises that the reading circuit 100 receives a pre-charge control signal to charge a first node corresponding to the first bit line, a second node corresponding to the second bit line, a third node of a first output end of the sensitive amplifier circuit, and a fourth node corresponding to a second output end of the sensitive amplifier circuit to an initial voltage.

In some embodiments of the invention, the reading method of the flow chart 300 further comprises that in the delay stage, a path between the first node and the third node of the reading circuit 100 is connected and a path between the second node and the fourth node of the reading circuit 100 is connected. In the delay stage, the reading method of the flow chart 300 further comprises the first node being discharged and the electric potential of the third node being maintained.

In some embodiments of the invention, the reading method of the flow chart 300 further comprises that when an amplified enable-signal is received, the path between the first node and the third node is disconnected and the path between the second node and the fourth node of the reading circuit 100 is disconnected, and a voltage difference between the third node and the fourth node is amplified to generate the output signal.

In some embodiments of the invention, the reading method of the flow chart 300 further comprises that when pre-charge control signal, the amplified enable-signal and the word line signal are changed to 0V, the output signal is outputted to the output node and the output signal is latched in the latch circuit.

Compared to the traditional reading circuit, the reading circuit and method provided by the invention can reduce the power consumption and achieve higher reliability. Furthermore, compared to a traditional reading circuit, the reading circuit and method provided by the invention can achieve higher reading speeds.

Reference throughout this specification to "one embodiment" or "an embodiment" means that a particular feature, structure, or characteristic described in connection with the embodiment is included in at least one embodiment of the invention, but does not denote that they are present in every embodiment. Thus, the appearance of the phrases "in one embodiment" or "in an embodiment" in various places throughout this specification are not necessarily referring to the same embodiment of the invention.

The above paragraphs describe many aspects of the invention. Obviously, the teaching of the invention can be accomplished by many methods, and any specific configurations or functions in the disclosed embodiments only present a representative condition. Those who are skilled in this technology will understand that all of the disclosed aspects in the invention can be applied independently or be incorporated.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A reading circuit, comprising:
   a sensitive amplifier circuit, coupled to a first bit line and a second bit line to connect a storage device, and comprising a first inverter and a second inverter, wherein the first bit line is directly coupled to a source of a first PMOS transistor of the first inverter, and the second bit line is directly coupled to a source of a second PMOS transistor of the second inverter, wherein the sensitive amplifier circuit further comprises a third PMOS transistor and a fourth PMOS transistor, and wherein a drain of the third PMOS transistor is coupled to the first bit line and a drain of the fourth PMOS transistor is coupled to the second bit line, and a source of the third PMOS transistor is coupled to a drain of the first PMOS transistor and a source of the fourth PMOS transistor is coupled to a drain of the second PMOS transistor; and
   a latch circuit, coupled to the sensitive amplifier circuit, and outputting an output signal generated by the sensitive amplifier circuit.

2. The reading circuit of claim 1, wherein in an initial stage, the sensitive amplifier circuit receives a pre-charge control signal to charge a first node corresponding to the first bit line, a second node corresponding to the second bit line, a third node of a first output end of the sensitive amplifier circuit, and a fourth node corresponding to a second output end of the sensitive amplifier circuit to an initial voltage.

3. The reading circuit of claim 2, wherein the latch circuit is a single-ended-output latch circuit.

4. The reading circuit of claim 3, wherein when the single-ended-output latch circuit receives the pre-charge control signal, the single-ended-output latch circuit is enabled.

5. The reading circuit of claim 2, wherein in a delay stage, a path between the first node and the third node is connected and a path between the second node and the fourth node is connected.

6. The reading circuit of claim 5, wherein in the delay stage, the storage device discharges the first node and electric potential of the third node is maintained.

7. The reading circuit of claim 2, wherein when the sensitive amplifier circuit receives an amplified enable-signal, the path between the first node and the third node is disconnected, the path between the second node and the fourth node is disconnected, and a voltage difference between the third node and the fourth node is amplified to generate the output signal.

8. The reading circuit of claim 7, wherein when the pre-charge control signal, the amplified enable-signal and a word line signal are changed from a high electric potential to 0, the latch circuit outputs the output signal to an output node and latches the output signal.

9. The reading circuit of claim 2, further comprising
   a matching circuit, coupled to the fourth node of the sensitive amplifier circuit, wherein the matching circuit is configured according to the latch circuit.

10. A reading method, applied to a reading circuit, comprising:
    reading, via the reading circuit, data of a storage device from a first bit line and a second bit line, wherein a first bit line is directly coupled to a drain of a first PMOS transistor of a first inverter of the reading circuit, and the second bit line is directly coupled to a drain of a second PMOS transistor of a second inverter of the reading circuit, wherein the reading circuit further comprises a third PMOS transistor and a fourth PMOS transistor, and wherein a drain of the third PMOS transistor is coupled to the first bit line and a drain of the fourth PMOS transistor is coupled to the second bit line, and a source of the third PMOS transistor is coupled to a drain of the first PMOS transistor and a source of the fourth PMOS transistor is coupled to a drain of the second PMOS transistor; and
    generating, using a sensitive amplifier circuit of the reading circuit, an output signal; and
    outputting, from a latch circuit of the reading circuit, the output signal.

11. The reading method of claim 10, further comprising:
    receiving a pre-charge control signal to charge a first node corresponding to the first bit line, a second node corresponding to the second bit line, a third node of a first output end of the sensitive amplifier circuit, and a fourth node corresponding to a second output end of the sensitive amplifier circuit to an initial voltage.

12. The reading method of claim 11, wherein the latch circuit is a single-ended-output latch circuit.

13. The reading method of claim 12, wherein when the single-ended-output latch circuit receives the pre-charge control signal, the single-ended-output latch circuit is enabled.

14. The reading method of claim 11, further comprising:
    in a delay stage, connecting a path between the first node and the third node and a path between the second node and the fourth node.

15. The reading method of claim 14, further comprising:
    in the delay stage, discharging the first node and maintaining electric potential of the third node.

16. The reading method of claim 11, further comprising:
    when an amplified enable-signal is received, disconnecting the path between the first node and the third node and the path between the second node and the fourth node is disconnected; and
    amplifying a voltage difference between the third node and the fourth node to generate the output signal.

17. The reading method of claim 16, further comprising:
    when the pre-charge control signal, the amplified enable-signal and a word line signal are changed from a high electric potential to 0, outputting the output signal to an output node; and
    latching the output signal in the latch circuit.

18. The reading method of claim 11, further comprising:
    configuring the matching circuit in the reading circuit according to the latch circuit.

* * * * *